US010497599B2

(12) United States Patent
Ootomo et al.

(10) Patent No.: US 10,497,599 B2
(45) Date of Patent: Dec. 3, 2019

(54) CORROSION-RESISTANT MEMBER, MEMBER FOR ELECTROSTATIC CHUCK, AND PROCESS FOR PRODUCING CORROSION-RESISTANT MEMBER

(71) Applicant: SUMITOMO OSAKA CEMENT CO., LTD., Tokyo (JP)

(72) Inventors: Megumi Ootomo, Tokyo (JP); Kentaro Takahashi, Tokyo (JP); Nobuhiro Hidaka, Tokyo (JP); Hironori Kugimoto, Tokyo (JP)

(73) Assignee: SUMITOMO OSAKA CEMENT CO., LTD, Tokyo (JP)

( * ) Notice: Subject to any disclaimer, the term of this patent is extended or adjusted under 35 U.S.C. 154(b) by 206 days.

(21) Appl. No.: 15/513,107

(22) PCT Filed: Aug. 25, 2015

(86) PCT No.: PCT/JP2015/073891
§ 371 (c)(1),
(2) Date: Mar. 21, 2017

(87) PCT Pub. No.: WO2016/052010
PCT Pub. Date: Apr. 7, 2016

(65) Prior Publication Data
US 2017/0294331 A1 Oct. 12, 2017

(30) Foreign Application Priority Data

Sep. 29, 2014 (JP) .................................. 2014-198317
Jun. 30, 2015 (JP) .................................. 2015-131217

(51) Int. Cl.
*H01L 21/683* (2006.01)
*C04B 35/44* (2006.01)
(Continued)

(52) U.S. Cl.
CPC .......... *H01L 21/6833* (2013.01); *C04B 35/44* (2013.01); *C04B 35/6263* (2013.01);
(Continued)

(58) Field of Classification Search
CPC .............. C04B 35/44; C04B 35/62655; C04B 35/6263; C04B 35/638; C04B 35/645;
(Continued)

(56) References Cited

U.S. PATENT DOCUMENTS

| 8,358,493 B2 | 1/2013 | Kugimoto et al. |
| 2011/0149462 A1* | 6/2011 | Kugimoto ........... H01L 21/6831 361/234 |

(Continued)

FOREIGN PATENT DOCUMENTS

| JP | 63-236213 A | 10/1988 |
| JP | 2004-315308 A | 11/2004 |

(Continued)

OTHER PUBLICATIONS

Machine Translation of Sumitomo Japanese Patent Document JP S63-236213 A Oct. 3, 1988 (Year: 1988).*

(Continued)

*Primary Examiner* — Kevin J Comber
(74) *Attorney, Agent, or Firm* — Greenblum & Bernstein, P.L.C.

(57) ABSTRACT

Provided are a corrosion-resistant member; a member for an electrostatic chuck; and a process for producing the corrosion-resistant member. The corrosion-resistant member includes an oxide which includes samarium and aluminum and has a perovskite type structure. The member for an electrostatic chuck includes the corrosion-resistant member. The process for producing a corrosion-resistant member includes: mixing aluminum oxide powder and samarium oxide powder with a solvent to prepare a slurry including the (Continued)

aluminum oxide powder and the samarium oxide powder; drying the slurry to prepare a mixed powder including the aluminum powder and the samarium oxide powder, and molding the mixed powder to prepare a green body; and calcinating the green body to prepare a sintered body.

5 Claims, 1 Drawing Sheet

(51) Int. Cl.
*C04B 35/645* (2006.01)
*C04B 35/626* (2006.01)
*C04B 35/638* (2006.01)

(52) U.S. Cl.
CPC ...... *C04B 35/62655* (2013.01); *C04B 35/638* (2013.01); *C04B 35/645* (2013.01); *C04B 35/6455* (2013.01); *C04B 2235/3217* (2013.01); *C04B 2235/3224* (2013.01); *C04B 2235/5445* (2013.01); *C04B 2235/662* (2013.01); *C04B 2235/761* (2013.01); *C04B 2235/77* (2013.01); *C04B 2235/96* (2013.01); *C04B 2235/9692* (2013.01)

(58) Field of Classification Search
CPC ........ C04B 35/6455; C04B 2235/9692; C04B 2235/3224; C04B 2235/761; C04B 2235/3217; C04B 2235/5445; C04B 2235/662; C04B 2235/77; C04B 2235/96; H01L 21/6833

USPC .......................................................... 361/234
See application file for complete search history.

(56) References Cited

U.S. PATENT DOCUMENTS

2012/0252657 A1* 10/2012 Sato .................... C04B 35/4682
                                                                    501/139
2016/0251265 A1    9/2016 Takahashi et al.

FOREIGN PATENT DOCUMENTS

| JP | 2008-297136 A | 12/2008 |
| JP | 2011-151336 A | 8/2011 |
| JP | 2012-094826 A | 5/2012 |
| WO | 2015-056702 A1 | 4/2015 |

OTHER PUBLICATIONS

Machine Translation of Kugimoto et al Japanese Patent Document JP 2012-094826 A May 17, 2012 (Year: 2012).*
WIPO, Priority International Patent Application, Publication No. WO 2016/052010 A1 with ISR. See pp. 20-21 for English translation of ISR.
Wei et al., "Study on Crystallography of RAlO3(R=rare earth elements)", Journal of Inorganic Materials, vol. 11, No. 3, Sep. 30, 1996.

* cited by examiner

CORROSION-RESISTANT MEMBER, MEMBER FOR ELECTROSTATIC CHUCK, AND PROCESS FOR PRODUCING CORROSION-RESISTANT MEMBER

TECHNICAL FIELD

The present invention relates to a corrosion-resistant member, a member for an electrostatic chuck, and a process for producing a corrosion-resistant member, and more specifically relates to a corrosion-resistant member having high corrosion resistance to halogen corrosive gas such as fluorine corrosive gas or chlorine corrosive gas and plasma thereof, a member for an electrostatic chuck including the corrosion-resistant member, and a process for producing the corrosion-resistant member.

BACKGROUND ART

In a manufacturing line for a semiconductor device such as IC, LSI, or VLSI, there are steps in which halogen corrosive gas such as fluorine corrosive gas or chlorine corrosive gas and plasma thereof are used. In these steps, for example, a process such as dry etching, plasma etching, or cleaning is performed on a semiconductor wafer which is fixed to an electrostatic chuck. In this process, fluorine gas such as $CF_4$, $SF_6$, HF, $NF_3$, or $F_2$, chlorine gas such as $Cl_2$, $SiCl_4$, $BCl_3$, or HCl, or plasma of the gas is used. Since the corrosive gas and plasma thereof are highly corrosive, there is a problem in that a member for an electrostatic chuck constituting an electrostatic chuck is corroded by the corrosive gas and plasma thereof. Therefore, in the related art, as a corrosion-resistant material which is used in a member for an electrostatic chuck, for example, yttrium-aluminum-garnet ($Y_3Al_5O_{12}$; hereinafter, abbreviated as YAG) or a compound obtained by adding a rare earth oxide other than yttrium oxide to YAG is used (for example, refer to Patent Literature Nos. 1 to 3).

CITATION LIST

Patent Literature

[Patent Literature No. 1] Japanese Laid-open Patent Publication No. 2004-315308
[Patent Literature No. 2] Japanese Laid-open Patent Publication No. 2011-151336
[Patent Literature No. 3] Japanese Laid-open Patent Publication No. 2012-94826

SUMMARY OF INVENTION

Technical Problem

The corrosion-resistant member described in Patent Literature Nos. 1 to 3 has high corrosiveness to halogen corrosive gas such as fluorine corrosive gas or chlorine corrosive gas and plasma thereof. The corrosion-resistant member is used particularly as a member for an electrostatic chuck. Therefore, high corrosiveness is important, and in a case where the corrosion-resistant member is used as a member for an electrostatic chuck, it is important that an adsorption force of the electrostatic chuck is strong when an electric field is applied and that a residual adsorption force of the electrostatic chuck is weak when the application of the electric field is stopped. Therefore, an object of the present invention is to provide: a corrosion-resistant member in which, in a case where the corrosion-resistant member is used as a member for an electrostatic chuck, an adsorption force of the electrostatic chuck can be made to be stronger than in the related art when an electric field is applied and a residual adsorption force of the electrostatic chuck can be made to be weaker than in the related art when the application of the electric field is stopped; a member for an electrostatic chuck; and a process for producing a corrosion-resistant member.

Solution to Problem

In the related art, most of perovskite type compounds have a structure distorted from a cubic lattice such as a tetragonal, orthorhombic, or trigonal lattice. Therefore, it is thought that these perovskite type compounds are ferroelectric and are inappropriate for use in a member for an electrostatic chuck to which a strong electric field is applied. However, the present inventors found that $SmAlO_3$ is preferable for use as a member for an electrostatic chuck although it has an orthorhombic perovskite type structure ($LaAlO_3$ type structure), thereby completing the present invention. That is, the present invention is as follows.

[1] A corrosion-resistant member including
an oxide which includes samarium and aluminum and has a perovskite type structure.
[2] The corrosion-resistant member according to [1], in which a proportion of the oxide in the corrosion-resistant member is 80 vol % or higher.
[3] The corrosion-resistant member according to [1] or [2],
in which a range of samarium:aluminum (molar ratio) in the oxide is 73:27 to 9:91.
[4] The corrosion-resistant member according to any one of [1] to [3], having a residual adsorption force of 1.0 to 0.9 kPa,
in which a voltage of 2.0 kV is applied to the corrosion-resistant member having a thickness of 1 mm for 60 seconds in an atmosphere in which a pressure is lower than 0.5 Pa, a 1-inch silicon wafer is adsorbed on the corrosion-resistant member, an application of the voltage is stopped, and then the residual adsorption force is measured.
[5] A member for an electrostatic chuck including
the corrosion-resistant member according to anyone of [1] to [4].
[6] A process for producing a corrosion-resistant member, the process including:
a step of mixing aluminum oxide powder and samarium oxide powder with a solvent to prepare a slurry including the aluminum oxide powder and the samarium oxide powder;
a step of drying the slurry to prepare a mixed powder including the aluminum powder and the samarium oxide powder, and molding the mixed powder to prepare a green body; and
a step of calcinating the green body to prepare a sintered body.
[7] The process for producing a corrosion-resistant member according to [6], further including
a step of annealing the sintered body.

Advantageous Effects of Invention

According to the present invention, it is possible to provide: a corrosion-resistant member in which, in a case where the corrosion-resistant member is used as a member for an electrostatic chuck, an adsorption force of the electrostatic chuck can be made to be strong when an electric field is applied and a residual adsorption force of the electrostatic chuck can be made to be weak when the application of the electric field is stopped; a member for an electrostatic chuck; and a process for producing a corrosion-resistant member.

DESCRIPTION OF EMBODIMENTS

[Corrosion-Resistant Member]

Figure 1:
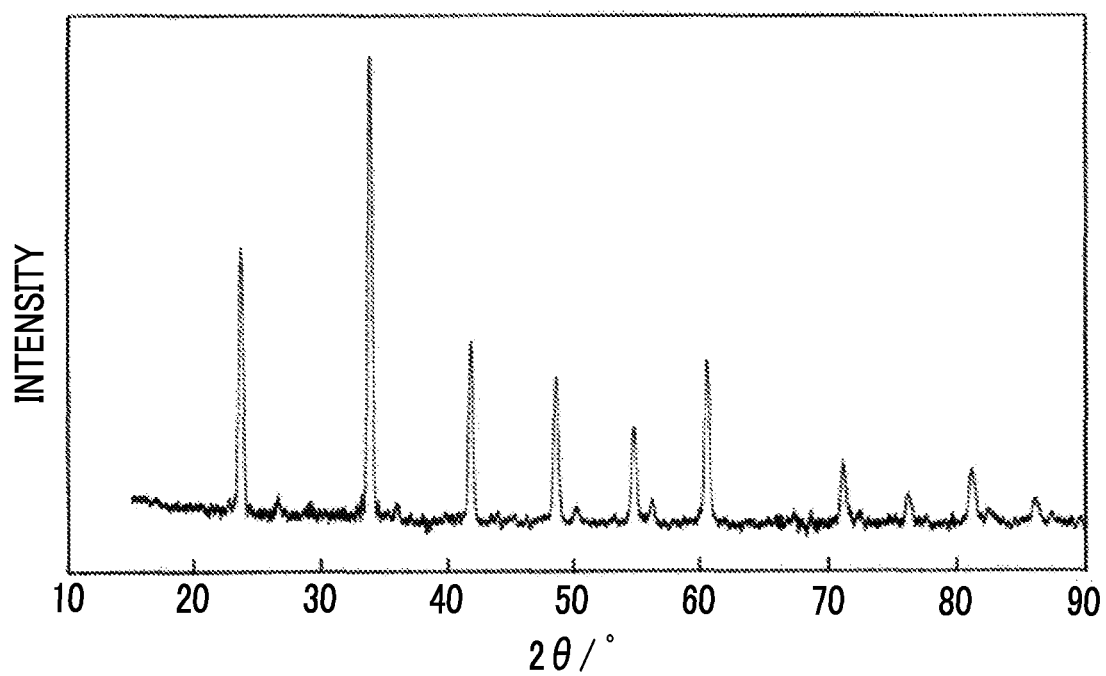
FIG. 1 is a diagram showing a X-ray diffraction pattern of Example 1.

A corrosion-resistant member according to the present invention includes an oxide which includes samarium and aluminum and has a perovskite type structure. The oxide which includes samarium and aluminum and has a perovskite type structure is, for example, $SmAlO_3$.

In the corrosion-resistant member according to the present invention, the oxide may further include another element as long as it includes samarium and aluminum and has a perovskite type structure. However, it is preferable that most part of all the atoms constituting the oxide is occupied by samarium, aluminum, and oxygen.

A range of samarium:aluminum (molar ratio) in the oxide is preferably 73:27 to 9:91, more preferably 73:27 to 14:86, still more preferably 73:27 to 19:81, still more preferably 73:27 to 26:74, still more preferably 73:27 to 35:65, still more preferably 65:35 to 40:60, still more preferably 60:40 to 45:55, and still more preferably 60:40 to 47:53. In a case where the range of samarium:aluminum (molar ratio) in the oxide is 73:27 to 9:91, a major structure of the oxide can be made to be a perovskite type structure.

A proportion of the oxide in the corrosion-resistant member according to the present invention is preferably 80 vol % or higher, more preferably 90 vol % or higher, and still more preferably 95 vol % or higher. In a case where the proportion of the oxide in the corrosion-resistant member is 80 vol % or higher, a dielectric constant of the corrosion-resistant member can be improved. In addition, in a case where the corrosion-resistant member according to the present invention is used in a member for an electrostatic chuck, an adsorption force of the electrostatic chuck can be made to be strong when an electric field is applied, and a residual adsorption force of the electrostatic chuck can be made to be weak when the application of the electric field is stopped.

A relative dielectric constant of the corrosion-resistant member according to the present invention at a frequency of 40 Hz is preferably 20 or higher, more preferably 23 or higher, and still more preferably 25 or higher. Assuming that the relative dielectric constant of the corrosion-resistant member according to the present invention is 20 or higher, in a case where the corrosion-resistant member is used as a member for an electrostatic chuck, an adsorption force of the electrostatic chuck can be made to be strong when an electric field is applied.

A bending strength of the corrosion-resistant member according to the present invention is preferably 150 MPa or higher, more preferably 160 MPa or higher, and still more preferably 170 MPa or higher. Here, the bending strength is a value measured in a four-point bending test according to JIS R1601. Assuming that the bending strength of the corrosion-resistant member is 150 MPa or higher, in a case where the corrosion-resistant member is used as a member for an electrostatic chuck, there is no practical problem in strength.

A relative density of the corrosion-resistant member according to the present invention is preferably 97% or higher, more preferably 97.5% or higher, and still more preferably 98% or higher. In a case where the relative density of the corrosion-resistant member is 97% or higher, the strength of the corrosion-resistant member can be improved, and the relative dielectric constant of the corrosion-resistant member can be improved. In addition, pores in the corrosion-resistant member cause an increase in dielectric loss. Therefore, in a case where the relative density of the corrosion-resistant member is 97% or higher, dielectric loss of the corrosion-resistant member can be reduced.

An adsorption force is preferably 10 to 30 kPa and more preferably 12 to 30 kPa when measured after applying a voltage of 2.0 kV to the corrosion-resistant member having a thickness of 1 mm in an atmosphere in which a pressure is lower than 0.5 Pa such that a 1-inch silicon wafer is adsorbed on the corrosion-resistant member according to the present invention. In a case where the adsorption force is 10 to 30 kPa, by using the corrosion-resistant member according to the present invention as a member for an electrostatic chuck, a substrate such as a silicon wafer can be reliably fixed to the electrostatic chuck.

A residual adsorption force is preferably 0.1 to 0.9 kPa. The residual adsorption force is measured as follows. a voltage of 2.0 kV is applied to the corrosion-resistant member according to the present invention having a thickness of 1 mm for 60 seconds in an atmosphere in which a pressure is lower than 0.5 Pa, a 1-inch silicon wafer is adsorbed on the corrosion-resistant member, an application of the voltage is stopped, and then the residual adsorption force is measured. In a case where the residual adsorption force is 0.1 to 0.9 kPa, by using the corrosion-resistant member according to the present invention as a member for an electrostatic chuck, a substrate such as a silicon wafer can be easily removed from the electrostatic chuck after being processed.

[Process for Producing Corrosion-Resistant Member]

A process for producing a corrosion-resistant member according to the present invention includes: a step (A) of mixing aluminum oxide powder and samarium oxide powder with a solvent to prepare a slurry including the aluminum oxide powder and the samarium oxide powder; a step (B) of drying the slurry to prepare a mixed powder including the aluminum powder and the samarium oxide powder, and molding the mixed powder to prepare a green body; and a step (C) of calcinating the green body to prepare a sintered body.

(Step (A))

In the step (A), aluminum oxide powder and samarium oxide powder are mixed with a solvent to prepare a slurry including the aluminum oxide powder and the samarium oxide powder. An average particle diameter of each of the aluminum oxide powder and the samarium oxide powder is preferably 0.01 to 1.0 µm. In a case where the average particle diameter of each of the aluminum oxide powder and the samarium oxide powder is 0.01 to 1.0 µm, a corrosion-resistant member having a high relative density can be obtained. In addition, segregation of aluminum and samarium in the corrosion-resistant member can be prevented. In addition, an average particle diameter of the mixed powder including the aluminum oxide powder and the samarium oxide powder is preferably 0.01 to 1.0 µm. The average particle diameter refers to a volume average particle diameter of primary particles which is measured using a laser diffraction scattering method.

A BET specific surface area of the aluminum oxide powder and the samarium oxide powder is preferably 5 to 25 m$^2$/g. In a case where the BET specific surface area of the aluminum oxide powder and the samarium oxide powder is 5 to 25 m$^2$/g, a corrosion-resistant member having a high relative density can be obtained. The BET specific surface area is a specific surface area measured using a BET method in which nitrogen gas is used.

Examples of the solvent used in the step (A) include water, methanol, ethanol, propanol, butanol, toluene, xylene, acetone, methylene chloride, ethyl acetate, dimethylformamide, and diethyl ether. As the solvent, at least one selected from the group consisting of water, methanol, ethanol, propanol, and butanol is preferably used. Since the aluminum oxide powder and the samarium oxide powder are mixed using the solvent, the aluminum oxide powder and the samarium oxide powder can be uniformly mixed.

A device used for mixing the aluminum oxide powder and the samarium oxide powder with the solvent is not particularly limited as long as it can prepare the slurry including the aluminum oxide powder and the samarium oxide powder. Examples of the device used for mixing the aluminum oxide powder and the samarium oxide powder with the solvent include a ball mill, a bead mill, a DISPERMILL, a homogenizer, a vibration mill, a sand grind mill, an attritor, an ultrasonic disperser, and a high-pressure disperser.

(Step (B))

In the step (B), the slurry is dried to prepare a mixed powder including the aluminum powder and the samarium oxide powder, and the mixed powder is molded to prepare a green body.

In order to easily mold the mixed powder, it is preferable that the mixed powder including the aluminum powder and the samarium oxide powder is granular. Therefore, it is preferable that the slurry is dried using a method capable of drying the slurry and forming granules. In order to dry the slurry, for example, a spray dryer, a pneumatic conveying dryer, or a fluid layer is used. In order to form the granules of the mixed powder, for example, a dispersant such as a polyacrylate, an antifoaming agent such as a polyethylene glycol antifoaming agent, a lubricant such as stearic acid, a binder such as polyvinyl alcohol, or a plasticizer such as polyethylene glycol may be added to the slurry. In the step (B), for example, the obtained mixed powder is uniaxially pressed in a mold or is isostatically pressed in a rubber die to obtain a green body.

In order to remove organic components such as a binder from the granular mixed powder, it is preferable that the mixed powder is degreased before molding. A temperature at which the mixed powder is degreased is, for example, 50° C. to 600° C.

(Step (C))

In the step (C), the green body is calcinated to prepare a sintered body. A calcination temperature at which the green body is calcinated is preferably 1400° C. to 1800° C., more preferably 1450° C. to 1750° C., and still more preferably 1500° C. to 1700° C. In a case where the calcination temperature is 1400° C. to 1800° C., a dense sintered body can be obtained, and the sintered body can be prevented from melting. A calcination time for which the green body is calcinated at the calcination temperature is preferably 1 to 5 hours, more preferably 1 to 4 hours, and still more preferably 1.5 to 3 hours. In a case where the calcination time is 1 to 5 hours, a dense sintered body can be obtained, and abnormal particle growth in the sintered body can be prevented. The green body may be calcinated in air or in an inert gas atmosphere.

In order to calcinate the green body, normal-pressure calcination may be used, but press calcination is preferable from the viewpoint that a more dense sintered body can be obtained. Examples of the pressure calcination include hot isostatic press (HIP) calcination, uniaxial hot press (HP) calcination, and multiaxial ultra high pressure press (UHP) calcination. A pressure applied to the green body when the green body is calcinated by press calcination is, for example, 10 to 40 MPa.

(Annealing Step (D))

The process for producing a corrosion-resistant member according to the present invention may further include a step (D) of annealing the sintered body. As a result, oxygen deficiency in the sintered body can be reduced. In a case where oxygen deficiency becomes severe in the sintered body, the dielectric constant is increased and the adsorption force is increased, but the resistance value is decreased. Therefore, the residual adsorption force is increased. In order to reduce oxygen deficiency, it is preferable that the sintered body is annealed in air. An annealing temperature is calcinated is preferably 1300° C. to 1600° C., more preferably 1350° C. to 1550° C., and still more preferably 1400° C. to 1500° C. In a case where the annealing temperature is 1300° C. to 1600° C., oxygen deficiency can be sufficiently reduced, and an excessive decrease in adsorption force can be prevented. An annealing time for which the sintered body is annealed at the annealing temperature is preferably 2 to 10 hours and more preferably 3 to 10 hours. In a case where the annealing time is 2 to 10 hours, oxygen deficiency can be sufficiently reduced, and an excessive decrease in adsorption force can be prevented.

[Member for Electrostatic Chuck]

A member for an electrostatic chuck according to the present invention includes the corrosion-resistant member according to the present invention. For example, the member for an electrostatic chuck includes: a plate-shaped body that has a sample placement surface on which a sample is electrostatically adsorbed; an internal electrode layer for electrostatic adsorption that is provided on a back surface of the plate-shaped body; an adhesive layer in which the internal electrode layer for electrostatic adsorption is embedded; and an insulating material layer that is provided on a surface of the adhesive layer opposite to the plate-shaped body. The corrosion-resistant member according to the present invention is used for at least the sample placement surface of the plate-shaped body in the electrostatic chuck member.

EXAMPLES

Next, the present invention will described in detail using Examples but is not limited to the Examples.

Regarding Examples and Comparative Examples described below, measurement and evaluation were performed as follows.

(1) Average Particle Diameter of Raw Material Powder

After a raw material powder was dispersed in water, and an average particle diameter of the raw material powder was measured using a particle diameter distribution analyzer (SALD-2000J, manufactured by Shimadzu Corporation).

(2) Relative Density of Corrosion-Resistant Member

The density of each of corrosion-resistant members according to Examples and Comparative Examples was measured using the Archimedes' principle, and the measured density was divided by a theoretical density obtained from the following expression to calculate a relative density.

Unit Cell Weight (g)=Unit Cell Weight of Each Crystal Phase of Samarium Aluminum Oxide× mol % of Each Crystal Phase Unit Cell Volume (cm$^3$)=Unit Cell Volume of Each Crystal Phase of Samarium Aluminum Oxide× mol % of Each Crystal Phase Theoretical Density (g/cm$^3$)=Unit Cell Weight/Unit Cell Volume mol % of each crystal phase of samarium aluminum oxide was calculated from the amount of the raw material powder added.

(3) Identification of Crystal Phase of Corrosion-Resistant Member

A crystal phase of each of the corrosion-resistant member obtained in Examples and Comparative Examples was identified using powder X-ray diffraction. In the powder X-ray diffraction, an X-ray diffractometer (X'Pert PRO MPD, manufactured by PANalytical B.V) was used.

(4) Relative Dielectric Constant of Corrosion-Resistant Member

After processed into a size φ48×1 mm, the relative dielectric constant of each of the corrosion-resistant members obtained in Examples and Comparative Examples at 40 MHz was measured using a charge/discharge tester (TOSCAT-3000, manufactured by Toyo System Co., Ltd.).

(5) Adsorption Force of Corrosion-Resistant Member

Each of the corrosion-resistant members obtained in Examples and Comparative Examples was processed into a thickness of 1.0 mm, and an adhesive layer embedded with an electrode was formed between the processed corrosion-resistant member and an alumina ceramic. As a result, an electrostatic chuck was prepared. The temperature of a sample placement surface of the electrostatic chuck was set as 25° C., a voltage of 2.0 kV was applied to the electrode for 60 seconds, and then a 1-inch silicon wafer was adsorbed on the electrostatic chuck in a vacuum (<0.5 Pa). Next, the adsorption force to the 1-inch silicon wafer was measured. In the measurement, the silicon wafer was peeled off using a load cell, and a maximum peeling stress generated at this time was set as the adsorption force.

(6) Residual Adsorption Force of Corrosion-Resistant Member

Each of the corrosion-resistant members obtained in Examples and Comparative Examples was processed into a thickness of 1.0 mm, and an adhesive layer embedded with an electrode was formed between the processed corrosion-resistant member and an alumina ceramic. As a result, an electrostatic chuck was prepared. The temperature of a sample placement surface of the electrostatic chuck was set as 25° C., a voltage of 2.0 kV was applied to the electrode for 60 seconds, and then a 1-inch silicon wafer was adsorbed on the electrostatic chuck in a vacuum (<0.5 Pa). Next, the application of the voltage was stopped, and a residual adsorption force to the 1-inch silicon wafer after the application of the voltage was stopped was measured. In the measurement, the silicon wafer was peeled off using a load cell, and a maximum peeling stress generated at this time was set as the residual adsorption force.

(7) Bending Strength of Corrosion-Resistant Member

The bending strength of each of the corrosion-resistant members obtained in Examples and Comparative Examples was measured using a four-point bending test according to JIS R1601. In the measurement, a bend tester (MARUTO JIS bend tester MZ-401, manufactured by Maruto Testing Machine Co.) was used.

(8) Corrosion Resistance Evaluation

Gas species (i) $CF_4/O_2/Ar$ (2/2/16 mL/min) and (ii) $SF_6$ (10 mL/min) were introduced into each of the corrosion-resistant members according to Examples and Comparative Examples to perform a plasma exposure test. Conditions were degree of vacuum: 1 mTorr, electrode frequency: 2.5 GHz, bias frequency: 13.56 MHz, voltage: 3400 V, current: 1.8 A, and plasma power: 420 W ($CF_4$) and 400 W ($SF_6$). Surface roughnesses of a non-exposed portion and an exposed portion were measured, and an etching rate was calculated based on a difference between the measured surface roughnesses.

Example 1

Aluminum oxide ($Al_2O_3$) powder (manufactured by Taimei Chemicals Co., Ltd., Model No.: TM-5D) and samarium oxide ($Sm_2O_3$) powder (manufactured by Nippon Yttrium Co., Ltd., Model No. N-SM3CP) were weighed such that a composition shown in Table 1 was obtained. The weighed aluminum oxide powder, the weighed samarium oxide powder, and 1% by mass (with respect to the total mass of the aluminum oxide powder and the samarium oxide powder) of a dispersant (manufactured by Chukyo Yushi Co., Ltd., Model No.: D-735) were put into a beaker containing water. The water content was adjusted in advance such that the solid content was 30%. Next, the components were mixed with each other through a wet process using a stirring blade and were dispersed using a ball mill to prepare a slurry of a mixed powder including the aluminum oxide powder and the samarium oxide powder. A portion of the slurry was collected, and the average particle diameter of the mixed powder including the aluminum oxide powder and the samarium oxide powder was measured. The measured average particle diameter was 0.541 μm.

This slurry was dried and granulated using a spray dryer (manufactured by BuCHI Labortechnik AG, Model No.: B-290) to prepare granules of the mixed powder. The granules of the mixed powder was heated and degreased at 500° C. for 4 hours. Next, this mixed powder was molded into a predetermined shape. Using a hot press machine (manufactured by Fuji Electronic Industrial Co., Ltd., Model No.: HIMULTI 5000), the green body was press-calcinated in argon under conditions of calcination temperature: 1600° C., calcination time: 2 hours, and pressure: 20 MPa. As a result, a sintered body was obtained. The obtained sintered body was annealed at an annealing temperature of 1480° C. for an annealing time of 3 hours. As a result, a corrosion-resistant member according to Example 1 was prepared.

Example 2

A corrosion-resistant member according to Example 2 was prepared using the same method as in Example 1, except that the calcination temperature was changed to 1700° C. The average particle diameter of the mixed powder including the aluminum oxide powder and the samarium oxide powder was 0.662 μm.

Example 3

A corrosion-resistant member according to Example 3 was prepared using the same method as in Example 1, except that the calcination temperature was changed to 1500° C. The average particle diameter of the mixed powder including the aluminum oxide powder and the samarium oxide powder was 0.578 μm.

Example 4

A corrosion-resistant member according to Example 4 was prepared using the same method as in Example 1, except that the calcination temperature was changed to 1450° C. The average particle diameter of the mixed powder including the aluminum oxide powder and the samarium oxide powder was 0.521 μm.

Example 5

A corrosion-resistant member according to Example 5 was prepared using the same method as in Example 1, except that the samarium:aluminum (molar ratio) was changed to 9:91. The average particle diameter of the mixed powder including the aluminum oxide powder and the samarium oxide powder was 0.552 μm.

Example 6

A corrosion-resistant member according to Example 6 was prepared using the same method as in Example 1, except that: the samarium:aluminum (molar ratio) was changed to 14:86; and the calcination temperature was changed to 1400° C. The average particle diameter of the mixed powder including the aluminum oxide powder and the samarium oxide powder was 0.548 μm.

Example 7

A corrosion-resistant member according to Example 6 was prepared using the same method as in Example 1, except that the samarium:aluminum (molar ratio) was changed to 19:81. The average particle diameter of the mixed powder including the aluminum oxide powder and the samarium oxide powder was 0.531 μm.

Example 8

A corrosion-resistant member according to Example 8 was prepared using the same method as in Example 1, except that: the samarium:aluminum (molar ratio) was changed to 26:74; and the calcination temperature was changed to 1500° C. The average particle diameter of the mixed powder including the aluminum oxide powder and the samarium oxide powder was 0.529 μm.

Example 9

A corrosion-resistant member according to Example 8 was prepared using the same method as in Example 1, except that: the samarium:aluminum (molar ratio) was changed to 47:53; and the calcination temperature was changed to 1550° C. The average particle diameter of the mixed powder including the aluminum oxide powder and the samarium oxide powder was 0.520 μm.

Comparative Example 1

A corrosion-resistant member according to Comparative Example 1 was prepared using the same method as in Example 1, except that yttrium oxide ($Y_2O_3$) powder (manufactured by Nippon Yttrium Co., Ltd., Model No.: YT3S) was used instead of the samarium oxide powder. A portion of the slurry of the mixed powder including the aluminum oxide powder and the yttrium oxide powder was collected, and the average particle diameter of the mixed powder including the aluminum oxide powder and the yttrium oxide powder was measured. The measured average particle diameter was 0.674 μm.

Comparative Example 2

A corrosion-resistant member according to Comparative Example 2 was prepared using the same method as in Example 1, except that yttrium oxide ($Y_2O_3$) powder (manufactured by Nippon Yttrium Co., Ltd., Model No.: YT3S) was used instead of the samarium oxide powder; and the aluminum oxide powder and the yttrium oxide powder were weighed such that a composition shown in Table 1 was obtained. A portion of the slurry of the mixed powder including the aluminum oxide powder and the yttrium oxide powder was collected, and the average particle diameter of the mixed powder including the aluminum oxide powder and the yttrium oxide powder was measured. The measured average particle diameter was 0.564 μm.

Comparative Example 3

A corrosion-resistant member according to Comparative Example 3 was prepared using the same method as in Example 1, except that: yttrium oxide ($Y_2O_3$) powder (manufactured by Nippon Yttrium Co., Ltd., Model No.: YT3S) was used in addition to the aluminum oxide powder and the samarium oxide powder; and the aluminum oxide powder, the samarium oxide powder, and the yttrium oxide powder were weighed such that a composition shown in Table 1 was obtained. A portion of the slurry of the mixed powder including the aluminum oxide powder, the samarium oxide powder, and the yttrium oxide powder was collected, and the average particle diameter of the mixed powder including the aluminum oxide powder, the samarium oxide, and the yttrium oxide powder was measured. The measured average particle diameter was 0.775 μm.

FIG. 1 shows an X-ray diffraction pattern of Example 1 as an example of an X-ray diffraction pattern measured to identify a crystal phase of each of the corrosion-resistant members obtained in Examples 1 to 4 and Comparative Examples 1 to 3. Crystal structures of the corrosion-resistant members obtained in Examples 1 to 4 and Comparative Example 1 were perovskite type structures. On the other hand, crystal structures of the corrosion-resistant members obtained in Comparative Examples 2 and 3 were garnet structures.

Tables 1 to 3 show the evaluation results of the corrosion-resistant members obtained in Examples 1 to 9 and Comparative Examples 1 to 3.

TABLE 1

|  | Example 1 | Example 2 | Example 3 | Example 4 |
|---|---|---|---|---|
| Raw Material Composition/ Molar Ratio | $0.50Sm_2O_3 \cdot 0.50Al_2O_3$ | $0.50Sm_2O_3 \cdot 0.50Al_2O_3$ | $0.50Sm_2O_3 \cdot 0.50Al_2O_3$ | $0.50Sm_2O_3 \cdot 0.50Al_2O_3$ |
| Crystal Composition of Sintered Body | $SmAlO_3$ | $SmAlO_3$ | $SmAlO_3$ | $SmAlO_3$ |
| Crystal Structure of Sintered Body | Perovskite | Perovskite | Perovskite | Perovskite |

TABLE 1-continued

|  | Example 1 | Example 2 | Example 3 | Example 4 |
|---|---|---|---|---|
| Calcination Temperature/(° C.) | 1600 | 1700 | 1500 | 1450 |
| Relative Density/(%) | 98 | 98.7 | 97.5 | 97.3 |
| Relative Dielectric Constant/40 MHz | 45.1 | 30.5 | 27.2 | 25.5 |
| Adsorption Force (+)/(kPa) | 28.5 | 20.2 | 14.5 | 12.5 |
| Adsorption Force (−)/(kPa) | 28.8 | 19 | 14.3 | 13 |
| Residual Adsorption Force (+)/(kPa) | 0.8 | 0.9 | 0.7 | 0.7 |
| Residual Adsorption Force (−)/(kPa) | 0.7 | 0.8 | 0.7 | 0.7 |
| Bending Strength/(MPa) | 200 | 180 | 190 | 170 |
| Corrosion Resistance Evaluation Etching Rate/(μm/hr) (($CF_4O_2$)Ar) | 0.02 | 0.02 | 0.03 | 0.04 |
| Corrosion Resistance Evaluation Etching Rate/(μm/hr) ($SF_6$/Ar) | 0.52 | 0.5 | 0.55 | 0.6 |

TABLE 2

|  | Example 5 | Example 6 | Example 7 | Example 8 | Example 9 |
|---|---|---|---|---|---|
| Raw Material Composition/Molar Ratio | $0.09Sm_2O_3 \cdot 0.91Al_2O_3$ | $0.14Sm_2O_3 \cdot 0.86Al_2O_3$ | $0.19Sm_2O_3 \cdot 0.81Al_2O_3$ | $0.26Sm_2O_3 \cdot 0.74Al_2O_3$ | $0.47Sm_2O_3 \cdot 0.53Al_2O_3$ |
| Crystal Composition of Sintered Body | $SmAlO_3$ | $SmAlO_3$ | $SmAlO_3$ | $SmAlO_3$ | $SmAlO_3$ |
| Crystal Structure of Sintered Body | Perovskite | Perovskite | Perovskite | Perovskite | Perovskite |
| Calcination Temperature/(° C.) | 1600 | 1400 | 1600 | 1500 | 1550 |
| Relative Density/(%) | 98.1 | 97 | 98.5 | 98.3 | 98.2 |
| Relative Dielectric Constant/40 MHz | 31 | 36 | 39 | 42 | 47 |
| Adsorption Force (+)/(kPa) | 19.1 | 23.1 | 23.5 | 25.1 | 27.8 |
| Adsorption Force (−)/(kPa) | 19.5 | 21.1 | 22.3 | 25.2 | 27.4 |
| Residual Adsorption Force (+)/(kPa) | 0.9 | 0.7 | 0.7 | 0.9 | 0.8 |
| Residual Adsorption Force (−)/(kPa) | 0.8 | 0.7 | 0.7 | 0.8 | 0.9 |
| Bending Strength/(MPa) | 324 | 298 | 269 | 258 | 215 |
| Corrosion Resistance Evaluation Etching Rate/(μm/hr) (($CF_4O_2$)Ar) | 0.09 | 0.08 | 0.07 | 0.05 | 0.04 |
| Corrosion Resistance Evaluation Etching Rate/(μm/hr) ($SF_6$/Ar) | 1.5 | 1.3 | 1 | 0.8 | 0.7 |

TABLE 3

|  | Comparative Example 1 | Comparative Example 2 | Comparative Example 3 |
|---|---|---|---|
| Raw Material Composition/Molar Ratio | $Y_2O_3 \cdot Al_2O_3$ | $3Y_2O_3 \cdot 5Al_2O_3$ | $0.1Sm_2O_3 \cdot 2.9Y_2O_3 \cdot 5Al_2O_3$ |
| Crystal Composition of Sintered Body | $YAlO_3$ | $Y_3Al_5O_{12}$ | $Sm_{0.1}T_{2.9}Al_5O_{12}$ |
| Crystal Structure of Sintered Body | Perovskite | Garnet | Garnet |
| Calcination Temperature/(° C.) | 1600 | 1600 | 1600 |
| Relative Density/(%) | 97.3 | 97.5 | 97.2 |
| Relative Dielectric Constant/40 MHz | 16.7 | 13 | 12 |
| Adsorption Force (+)/(kPa) | 4.3 | 9.7 | 5.1 |
| Adsorption Force (−)/(kPa) | 4.9 | 11.6 | 5.7 |
| Residual Adsorption Force (+)/(kPa) | 1 | 1 | 2.3 |
| Residual Adsorption Force (−)/(kPa) | 1.1 | 1 | 2.1 |

TABLE 3-continued

| | Comparative Example 1 | Comparative Example 2 | Comparative Example 3 |
|---|---|---|---|
| Bending Strength/(MPa) | 175 | 160 | 107 |
| Corrosion Resistance Evaluation Etching Rate/(μm/hr) (($CF_4O_2$)Ar) | 0.14 | 0.3 | 0.26 |
| Corrosion Resistance Evaluation Etching Rate/(μm/hr) ($SF_6$/Ar) | 0.52 | 0.8 | 0.501 |

As shown in Tables 1 to 3, it was found that all the relative densities of the corrosion-resistant members obtained in Examples 1 to 9 and Comparative Examples 1 to 3 were 97% or higher and the corrosion-resistant members obtained in Examples 1 to 9 and Comparative Examples 1 to 3 were dense sintered bodies. In addition, these corrosion-resistant members had excellent corrosion resistance.

The relative dielectric constants of the corrosion-resistant members obtained in Examples 1 to 9 were higher than those of the corrosion-resistant members obtained in Comparative Examples 1 to 3. It is presumed that the above results are obtained due to the following reasons: polarization is more likely to occur in the perovskite type structure than in the garnet structure; and polarization is large because the ionic radius of samarium is more than that of yttrium.

On the other hand, the adsorption forces of the corrosion-resistant members obtained in Examples 1 to 9 were higher than those of the corrosion-resistant members obtained in Comparative Examples 1 to 3. As a result, it was found that, by using each of the corrosion-resistant members obtained in Examples 1 to 9 as a member for an electrostatic chuck, a substrate such as a silicon wafer can be more reliably fixed to the electrostatic chuck.

In addition, the residual adsorption forces of the corrosion-resistant members obtained in Examples 1 to 9 were lower than those of the corrosion-resistant members obtained in Comparative Examples 1 to 3. As a result, it was found that, by using each of the corrosion-resistant members obtained in Examples 1 to 9 as a member for an electrostatic chuck, a substrate such as a silicon wafer can be more easily removed from the electrostatic chuck after a predetermined process was finished.

On the other hand, the bending strengths of the corrosion-resistant members obtained in Examples 1 to 9 were higher than those of the corrosion-resistant members obtained in Comparative Examples 2 and 3. As a result, it was found that, by using each of the corrosion-resistant members obtained in Examples 1 to 9 as a member for an electrostatic chuck, the strength of the electrostatic chuck can be increased.

The invention claimed is:

1. An electrostatic chuck member comprising an oxide consisting of samarium and aluminum, the oxide having a perovskite type structure.

2. The member according to claim 1, wherein a proportion of the oxide in the member is 80 vol % or higher.

3. The-member according to claim 1, wherein a range of samarium: aluminum (molar ratio) in the oxide is 73:27 to 9:91.

4. The member according to claim 1, having a residual adsorption force of 0.1 to 0.9 kPa, wherein the residual adsorption force is determined by:
   applying a voltage of 2.0 kV to the member having a thickness of 1 mm for 60 seconds in an atmosphere in which a pressure is lower than 0.5 Pa,
   adsorbing a 1-inch silicon wafer on the member,
   stopping the application of the voltage, and then
   measuring the residual adsorption force.

5. A process for producing an electrostatic chuck member, the process comprising:
   mixing aluminum oxide powder and samarium oxide powder with a solvent to prepare a slurry that includes the aluminum oxide powder and the samarium oxide powder;
   drying the slurry to prepare a mixed powder that consists of the aluminum powder and the samarium oxide powder, and molding the mixed powder to prepare a green body;
   calcinating the green body to prepare a sintered body; and
   annealing the sintered body.

* * * * *